United States Patent
Noble

[19]

[11] Patent Number: 5,969,924
[45] Date of Patent: Oct. 19, 1999

[54] SPARK GAP FOR OVERCOATED PRINTED CIRCUIT BOARDS

[75] Inventor: Robert H. Noble, Longmont, Colo.

[73] Assignee: Hewlett Packard Company, Palo Alto, Calif.

[21] Appl. No.: 08/936,065

[22] Filed: Sep. 23, 1997

[51] Int. Cl.⁶ ........................................... H02H 3/20
[52] U.S. Cl. .................. 361/56; 361/91.1; 361/777; 29/829
[58] Field of Search ....................... 361/56, 91, 111, 361/119, 760, 761, 762, 765, 748, 750, 777, 91.1; 174/250, 260, 261; 29/829

[56] References Cited

U.S. PATENT DOCUMENTS

| | | | |
|---|---|---|---|
| 3,676,742 | 7/1972 | Russell et al. | 361/56 |
| 4,160,210 | 7/1979 | Molinari | 325/362 |
| 4,472,876 | 9/1984 | Nelson | 29/840 |
| 4,520,228 | 5/1985 | Hoffmann | 174/68.5 |
| 4,586,105 | 4/1986 | Lippmann et al. | 361/117 |
| 4,617,605 | 11/1986 | Obrecht et al. | 361/220 |

OTHER PUBLICATIONS

Warren Boxleitner, Electrostatic Discharge and Electronic Equipment, pp. 1–7, (IEEE Press, 1989).

*Primary Examiner*—Ronald W. Leja
*Attorney, Agent, or Firm*—Kevin M. Hart

[57] ABSTRACT

A printed circuit spark gap for an overcoated printed circuit board. A metal-clad substrate is etched to form first and second printed circuit traces on the substrate. The first and second printed circuit traces define a channel having first and second ends. A layer of soldermask is deposited onto the substrate to cover a portion of the first and second printed circuit traces and to cover the channel except at an aperture. The aperture includes the spark gap. The first and second printed circuit traces and the channel are covered with a capping device. An overcoating material is applied to the printed circuit board. During the applying step, the overcoating material is allowed to infiltrate into the channel under the capping device at the first and second ends, but is not allowed to reach the aperture. Counter pressure buildup inside the channel, caused by the infiltration itself, stops the overcoating material before it reaches the intended clean area. The capping device may be removed, or may remain in the assembly. Also disclosed is an application of the inventive method for forming spark gaps having various topologies, all including the just-described channel.

6 Claims, 5 Drawing Sheets

SPARK GAP FOR OVERCOATED PRINTED CIRCUIT BOARDS

FIELD OF THE INVENTION

This invention relates to printed circuit spark gaps for absorbing electrostatic discharge events on printed circuit boards. More particularly, the invention relates to a printed circuit spark gap having improved resistance to contamination caused during application of protective overcoating layers to the printed circuit board.

BACKGROUND

Various apparatus have been devised to protect sensitive semiconductor components on printed circuit boards from damage caused by electrostatic energy. For applications requiring precise spark break-in voltages, discrete spark gap components resembling vacuum tubes are sometimes used. For other applications requiring less precision, it is less expensive to form a spark gap directly on the printed circuit board by providing a ground trace in close proximity with a signal trace, separated by an air space. The latter type of spark gap will be referred to herein as a "printed circuit spark gap."

One problem that has been encountered with printed circuit spark gaps is that, in order for them to work properly, the printed circuit traces opposing the gap must be relatively clean (i.e., free from contamination). In manufacturing, this requirement of printed circuit spark gaps must be reconciled with the requirement of applying a protective external coating to printed circuit boards that are intended for use in field environments, Throughout this disclosure, the application of such protective external coatings to printed circuit boards will be referred to as "overcoating."

One such protective overcoating technique is to cover the finished board with a conformal coating. Another technique is to overmold the finished board with a rubber-like elastomeric material. The latter technique is used not only to provide protection against moisture and other environmental conditions to which the board may be exposed during use, but is also sometimes used to create elastomeric structures that are helpful in securing the finished board to a frame or enclosure. Unfortunately, the materials used to create such protective external coatings can interfere with the operation of the printed circuit spark gap.

One prior technique that attempted to produce an elastomer-overmolded printed circuit board having a contaminant-free spark gap is illustrated in FIGS. 1–3. Two copper printed circuit traces 112, 114 were formed on an epoxy-fiberglass composite substrate 100 separated by a narrow space 118. A layer of soldermask 116 was applied to the printed circuit board, but was left open in aperture 117 containing spark gap area 118. A 0.050 inch diameter pin (hereinafter "shutoff pin") 120 was pressed down onto the assembly as shown at arrow 126. A support pin 124 was pressed against the assembly from the opposite side, as shown at arrow 128, to counteract the force of shutoff pin 120. Once shutoff pin 120 and support pin 124 were in place, elastomer was applied to the entire assembly. Typically, the elastomer was applied under high pressure, between 100 and 300 p.s.i. The intention was that the presence of shutoff pin 120 would prevent intrusion of elastomer into aperture 117 and spark gap area 118 during molding. Unfortunately, the profile of soldermask layer 116 over printed circuit traces 112, 114 caused a thin (approximately 0.001 inch) wide gap 130, 132 around the perimeter 122 of shutoff pin 120. The high-pressure elastomer easily infiltrated under shutoff pin 120 into gap 130, 132, causing contamination of aperture 117 and spark gap area 118.

Although theoretically it might be possible to reduce the elastomer intrusion problem by more perfectly aligning the perimeter of shutoff pin 120 with aperture 117, such a solution would require unfeasibly tight mechanical tolerances. Current manufacturing technology is only capable of aligning printed circuit features to within +/−0.005 to 0.015 inches of other mechanical features such as edges and alignment holes. This level of precision would be inadequate to align shutoff pin 120 closely enough with aperture 117 to prevent infiltration of overcoating material into the area of interest.

It is therefore an object of the present invention to provide a printed circuit spark gap that has superior resistance to contamination caused during manufacture of the printed circuit board, and that may be easily and inexpensively manufactured.

SUMMARY OF THE INVENTION

In a printed circuit spark gap according to a preferred embodiment of the invention, first and second printed circuit traces are formed on a substrate. The first and second printed circuit traces define a channel between them. The channel has first and second ends and has a length greater than its width. A layer of soldermask covers at least a portion of the first and second printed circuit traces and covers the channel except at an aperture. The aperture includes the spark gap. The aperture is preferably disposed approximately equidistant from the first and second ends of the channel. A layer of overcoating material, preferably either conformal coating or elastomeric coating extends into the channel from both of the first and second ends but terminates before reaching the aperture. The first and second ends of the channel are disposed close enough to one another that the pressure differential between them is small during the application of the layer of overcoating material.

In a further embodiment, the first printed circuit trace has first, second and third portions. The first and second portions approximately define a forward "C" shape, and the third portion forms a lobe approximately in the center of the forward "C" shape. The second printed circuit trace has fourth and fifth portions, the fourth and fifth portions approximately define an inverse "C" shape smaller than the forward "C" shape. The inverse "C" shape is disposed between the first and second portions and around the third portion. The spark gap is between the lobe and the second printed circuit trace.

DETAILED DESCRIPTION OF THE PREFERRED EMBODIMENTS

Figure 1:
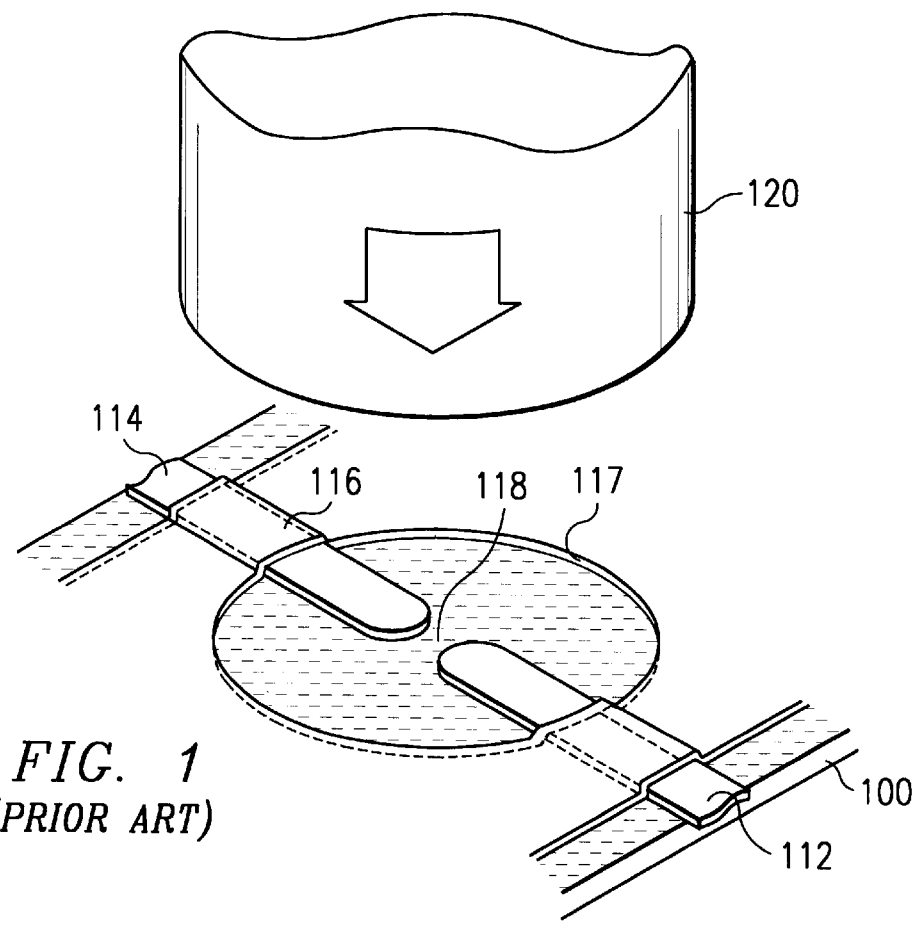
FIG. 1 is an oblique view of a prior art method for forming a spark gap on an elastomer-overmolded printed circuit board.
Figure 2:
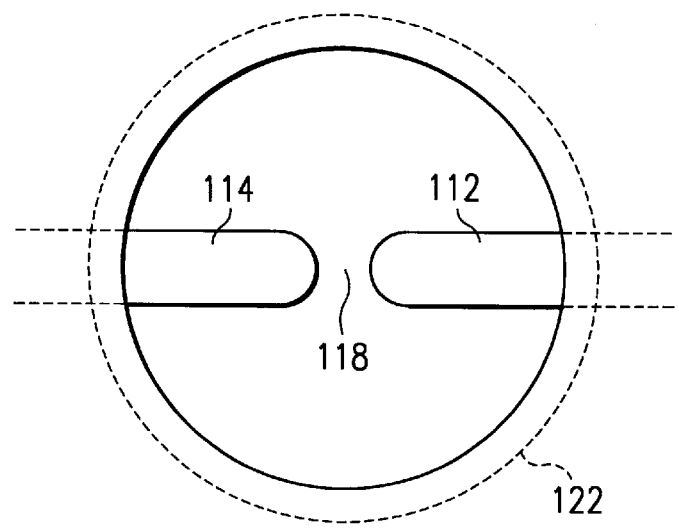
FIG. 2 is a top view of the prior art spark gap and method of FIG. 1.
Figure 3:
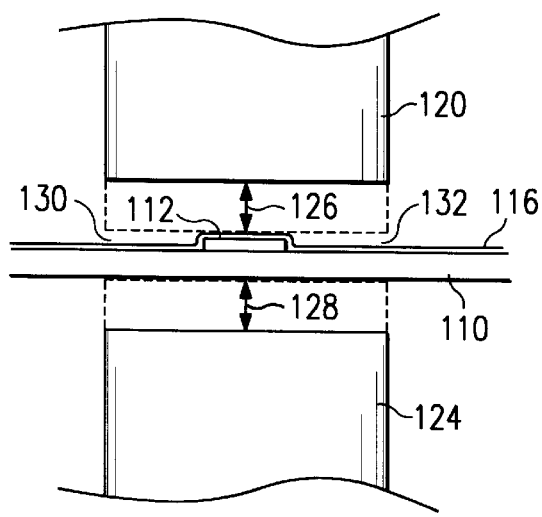
FIG. 3 is a side view of the prior art spark gap and method of FIG. 1.

FIGS. 4–7 illustrate a method for forming a spark gap on an overcoated printed circuit board according to a preferred embodiment of the invention.

A copper-clad printed circuit board substrate 200 is etched to form printed circuit traces 212, 214. (Preferably, substrate 200 should be made of an epoxyfiberglass composite material such as the well-known flame-retardant grade 4 or "FR-4," although other types of printed circuit substrate materials may be used.) The shape and relative orientation of printed circuit traces 212, 214 is such that they define a channel 215 between them having ends 219, 221. In the embodiment shown in FIGS. 4–7, printed circuit trace 214 has three portions 223, 225, 227. Portions 223, 225 form a forward "C" shape. Portion 227 forms a lobe disposed approximately in the center of the forward "C" shape. Printed circuit trace 212 has two portions 229, 231. Portions 229, 231 form an inverse "C" shape smaller than the forward "C" shape. The inverse "C" shape is disposed between portions 223, 225 and around lobe portion 227. In further embodiments, additional interlocking "C" shapes may be added to lengthen channel 215. Such further embodiments may be useful with higher overcoating pressures or with less viscous overcoating materials.

Figure 5:
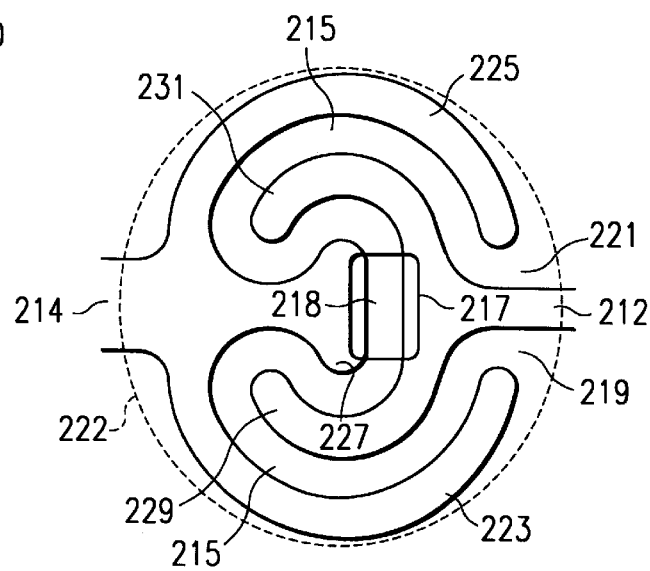
FIG. 5 is a top view of the spark gap and method of FIG. 4.
Figure 4:
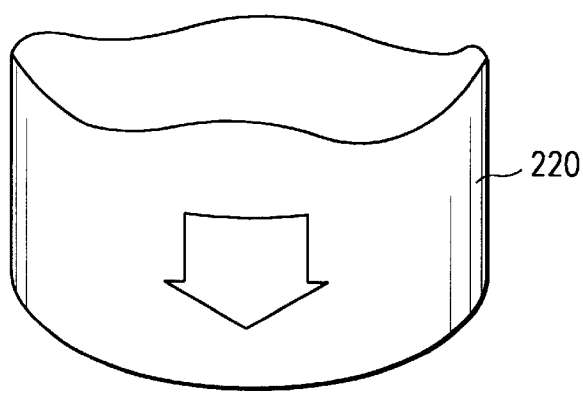
FIG. 4 is a an oblique view of a method for forming a spark gap on an overcoated printed circuit board according to a preferred embodiment of the invention.
Figure 4:
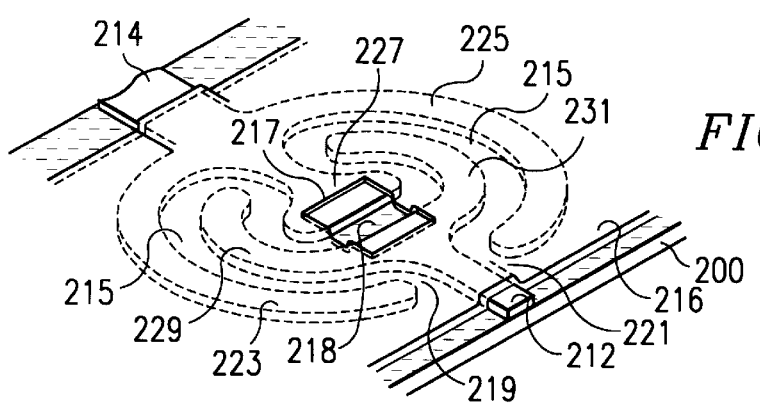
Figure 6:
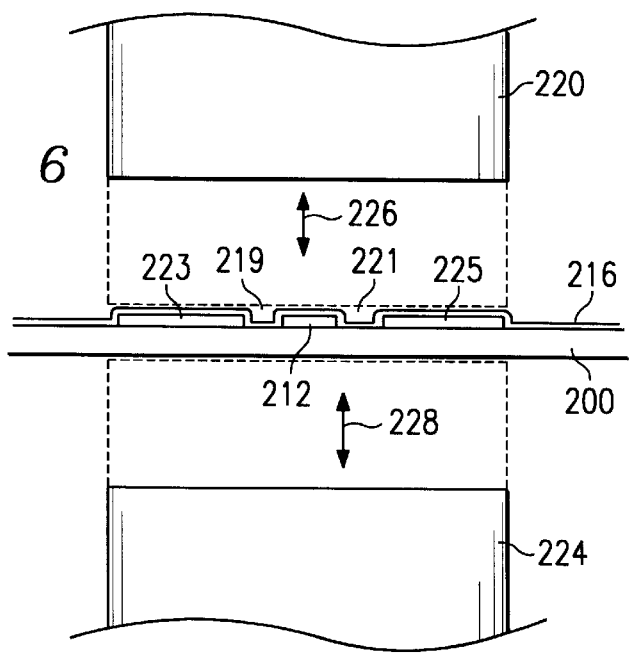
FIG. 6 is a side view of the spark gap and method of FIG. 4.
Figure 7:
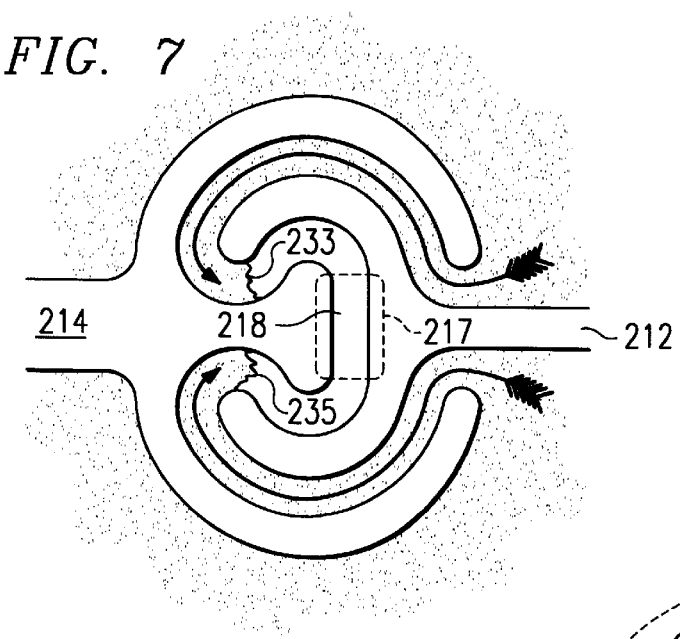
FIG. 7 is a top view of the spark gap of FIG. 4 illustrating infiltration of overcoating material into part of the assembly according to a preferred embodiment of the invention.
Figure 9:
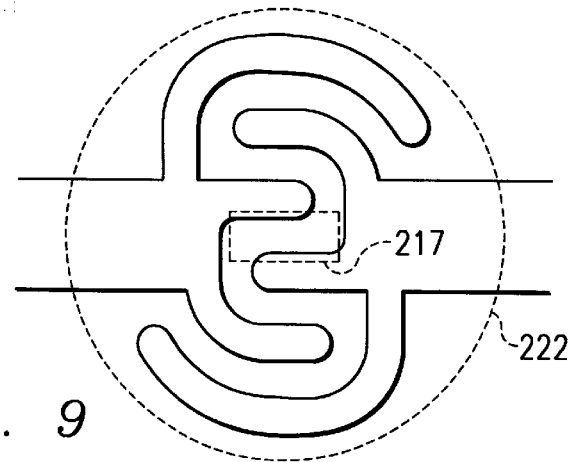
FIG. 9 is a top view illustrating a second alternative embodiment of the spark gap of FIG. 4.
Figure 8:
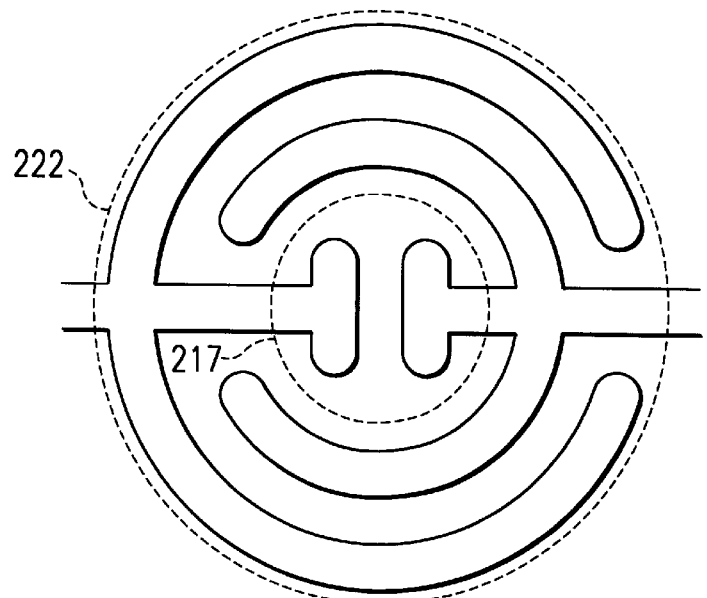
FIG. 8 is a top view illustrating a first alternative embodiment of the spark gap of FIG. 4.
Figure 10:
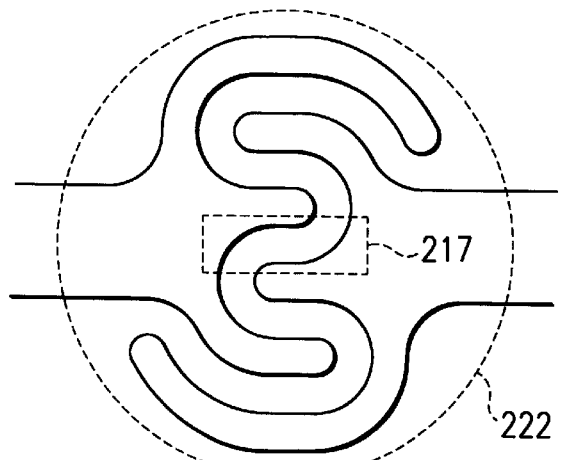
FIG. 10 is a top view illustrating a third alternative embodiment of the spark gap of FIG. 4.
Figure 11:
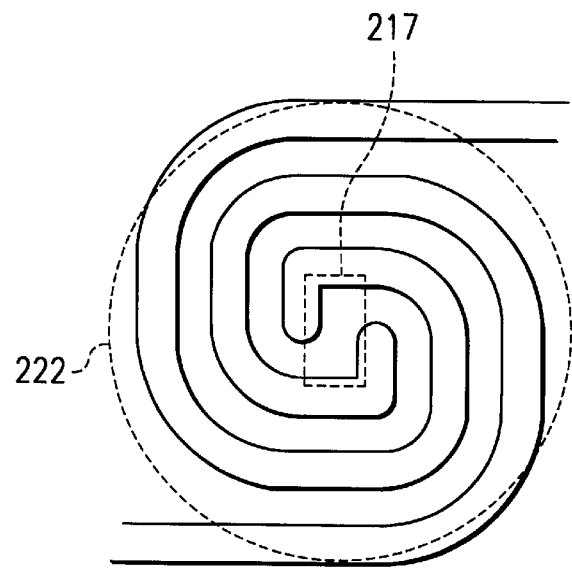
FIG. 11 is a top view illustrating a fourth alternative embodiment of the spark gap of FIG. 4.
Figure 12:
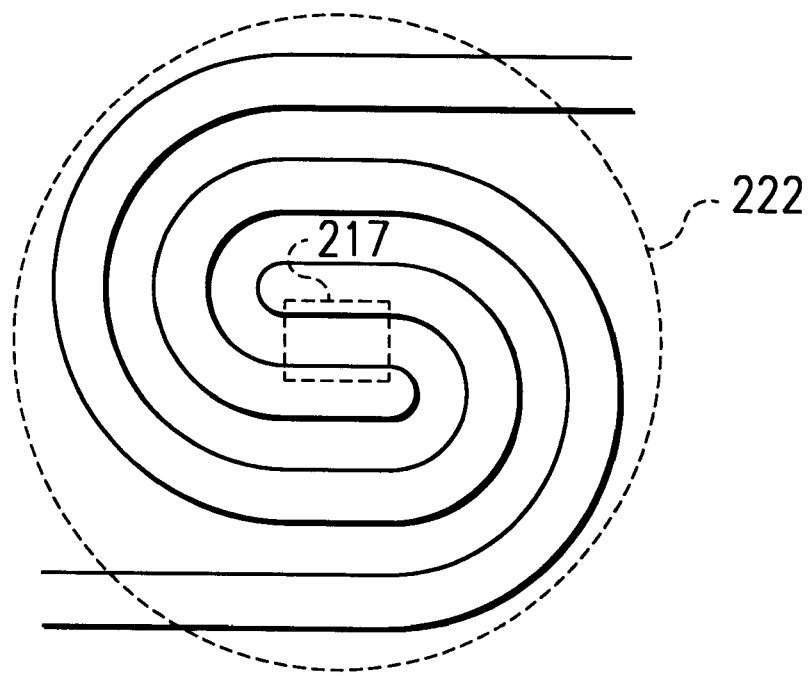
FIG. 12 is a top view illustrating a fifth alternative embodiment of the spark gap of FIG. 4.
Figure 13:
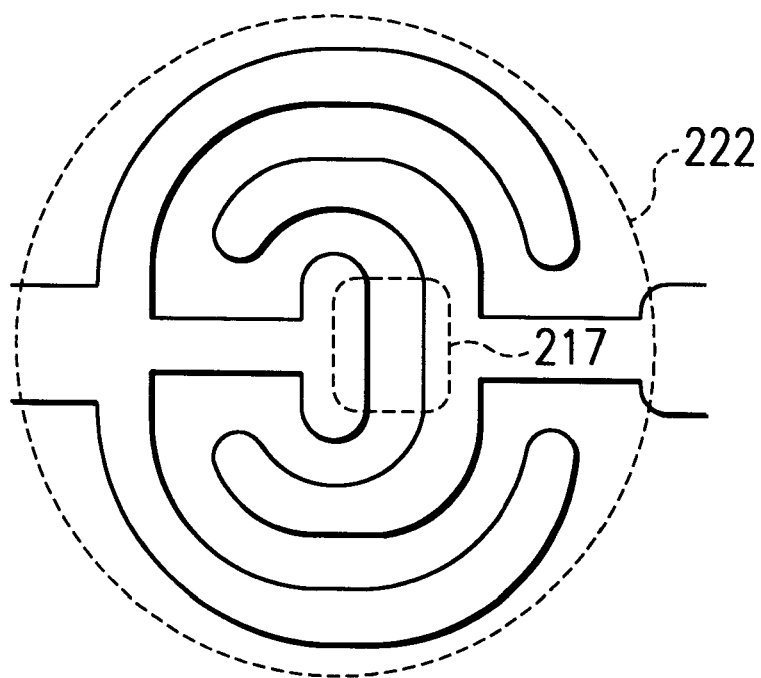
FIG. 13 is a top view illustrating a sixth alternative embodiment of the spark gap of FIG. 4.

After printed circuit traces 212, 214 are formed, a soldermask layer 216 is deposited over printed circuit traces 212, 214 as shown, except at an aperture 217. In the embodiment shown in FIGS. 4–7, aperture 217 has a rectangular shape. The portion of channel 215 between lobe 227 and printed circuit trace 212 forms a spark gap 218. In order to overmold or conformal coat the printed circuit board while keeping spark gap 218 free from contamination, shutoff pin 220 having perimeter footprint 222 is pressed against the assembly as shown by arrow 226. Shutoff pin 220 should have a flat surface where it engages the work piece, and perimeter 222 should be large enough in diameter to cover channel 215. A support pin 224 is pressed against the printed circuit board from the opposite side to counteract the force applied by shutoff pin 220. As can be seen in FIGS. 5-6, shutoff pin 220 forms a seal around printed circuit traces 212, 214 along perimeter 222, but does not seal the ends 219, 221 of channel 215. Thus, when elastomer or conformal coat is applied to the assembly under pressure (as indicated by the check-patterned area in FIG. 7), the elastomer or conformal coat material infiltrates channel 215, but only through channel ends 219, 221. As the elastomer or conformal coat material continues to infiltrate channel 215, a counter pressure builds up inside channel 215 because the air inside channel 215 is compressed. Eventually, the counter pressure inside channel 215 is sufficient to equalize the application pressure behind the infiltrating material, causing the infiltration to stop, as indicated by boundaries 233, 235.

Additionally, the small cross section of channel 215 provides some resistance to the infiltration of the finishing material. Placing aperture 217 and spark gap 218 equidistant from ends 219, 221 enhances the probability that infiltration will not reach the intended clean area.

In the embodiment shown in FIGS. 4–7, an elastomeric coating was used. In practice, it was observed that the counter pressure buildup within channel 215 was effective not only to stop infiltration of the elastomer before it reached aperture 217 and spark gap 218, but also to prevent infiltration of aerosols and other hydrocarbons associated with the elastomer from reaching aperture 217 and spark gap 218. Printed circuit trace portions 223, 225, 229 and 231 were each approximately 0.004 inches wide and 0.0015 inches thick. A layer of LPI soldermask approximately 0.0015 inches thick was used to create soldermask layer 216. The width of channel 215 was approximately 0.004 inches. The depth of channel 215, measured from the top of the soldermask covering printed circuit traces 212, 214 to the top of the soldermask covering the channel, was less than approximately 0.001 inches. Different channel lengths and depths may be appropriate depending on the type of overcoating material used (for example, conformal coat or elastomer) and the amount of pressure under which the overcoating material is applied. It was found that by placing channel ends 219, 221 near each other, as in the topology illustrated in FIGS. 4–7, the pressure gradient between the two ends was minimized during the application of elastomer.

Other topologies for printed circuit traces 212, 214 may be used without deviating from the scope of the invention. By way of example, FIGS. 8–13 are provided to illustrate some of the various alternative topologies that may be used to practice the invention. In each of the alternative configurations shown, two printed circuit traces are etched onto a metal-clad substrate in such a manner as to define a two-ended channel between the traces. When covered with a shutoff-pin, overcoating material will infiltrate into the channel from each end, but will cease infiltration when sufficient counter pressure is built up inside the channel, leaving a clean area in the center of the channel.

In practice, it was found that the use of electroless copper-nickel-gold plating ensures consistent thickness and good registration of the metallic layer. The use of "LPI" (liquid photo image-able) soldermask ensures consistent thickness, good coverage and good registration of the soldermask layer, although other kinds of soldermask such as dry film soldermask may be used. In a preferred embodiment, shutoff pin 220 was removed after the overmolding step. In embodiments in which shutoff pin 220 is removed, shutoff pin 220 may be a metal pin protruding from the mold cavity. In embodiments in which conformal coating is desired, shutoff pin 220 may be part of the conformal coat masking device. In other embodiments, a capping device having a flat bottom and a suitable diameter may serve the purpose of shutoff pin 220 or may be used in conjunction with shutoff pin 220, and may be left in the assembly after molding or conformal coating. In the latter kind of embodiment, the capping device should be constructed of a non-conductive material so as not to short circuit the spark gap.

While the invention has been described in detail herein with reference to particular embodiments, such embodiments are provided by way of illustration and not by way of limitation. It will be understood by those having skill in the art and having reference to this disclosure that numerous modifications may be made to the embodiments disclosed herein without deviating from the spirit and scope of the invention as defined by the following claims.

What is claimed is:

1. A printed circuit spark gap, comprising:

a substrate;

first and second printed circuit traces formed on said substrate, said first and second printed circuit traces defining a channel between them, said channel having first and second ends and having a length greater than its width;

a layer of soldermask covering at least a portion of said first and second printed circuit traces and covering said channel except at an aperture, said aperture comprising the spark gap; and a layer of overcoating material extending into said channel from both of said first and second ends but terminating before reaching said aperture;

wherein said channel turns at least 180 degrees between said first and second ends.

2. A printed circuit spark gap according to claim 1, wherein said aperture is disposed approximately equidistant from said first and second ends of said channel.

3. A printed circuit spark gap according to claim 1, wherein said overcoating material is chosen from the group consisting of conformal coating and elastomeric coating.

4. A printed circuit spark gap according to claim 1, wherein said first and second ends of said channel are disposed close enough to one another that the pressure differential between them is small during the application of said layer of overcoating material.

5. A printed circuit spark gap according to claim 1, wherein:

said first printed circuit trace has first, second and third portions, said first and second portions approximately defining a forward "C" shape, and said third portion forming a lobe approximately in the center of said forward "C" shape; and wherein said second printed circuit trace has fourth and fifth portions, said fourth and fifth portions approximately defining an inverse "C" shape smaller than said forward "C" shape, said inverse "C" shape disposed between said first and second portions and around said third portion.

6. A printed circuit spark gap according to claim 5, wherein said spark gap is between said lobe and said second printed circuit trace.

* * * * *